United States Patent [19]

Baker

[11] 4,112,510
[45] Sep. 5, 1978

[54] DYNAMIC MEMORY CELL WITH AUTOMATIC REFRESHING

[76] Inventor: Roger Thomas Baker, Box 240, Mt. Tabor, N.J. 07878

[21] Appl. No.: 800,450

[22] Filed: May 25, 1977

[51] Int. Cl.² .................... G11C 11/40; G11C 7/00
[52] U.S. Cl. .................................. 365/187; 307/238; 365/222
[58] Field of Search ................. 307/238; 365/187, 222

[56] References Cited

U.S. PATENT DOCUMENTS

| 3,699,544 | 10/1972 | Joynson et al. | 365/222 |
| 3,878,404 | 4/1975 | Walther et al. | 365/222 |

Primary Examiner—Stuart N. Hecker

[57] ABSTRACT

A dynamic memory cell with automatic refreshing is described which requires only three insulated gate field effect transistors (IGFETs). Binary datum is stored in the cell by maintaining the gate of the first IGFET high for a one and low for a zero. The second IFGET is used for cell selection in the read and write operations, and is in series with the first transistor. The third IGFET has one gate electrode, but the channel region of this transistor has two regions, and the surface potential vs. gate voltage characteristics of these two regions differ. Regardless of the datum stored in the cell, pulsing the gate of this third transistor refreshes the memory cell.

19 Claims, 12 Drawing Figures

DYNAMIC MEMORY CELL WITH AUTOMATIC REFRESHING

BACKGROUND OF THE INVENTION

This invention relates generally to semiconductor memory cells, and more particularly to dynamic semiconductor memory cells provided with automatic refreshing.

In the semiconductor memory industry, dynamic memory cells which require only one transistor and one capacitor are widely used, and fully static memory cells which require only four transistors and two resistors are widely used. Other types of static memory cells use six transistors. Typically, in a dynamic memory cell without automatic refreshing, the datum stored in the cell is periodically refreshed by first reading the datum and then re-entering it. The number of memory cells that can be simultaneously refreshed is limited to the number of sense amps provided. Also, additional circuitry is required to control the refresh operation, and the memory is not available for read or write operations while it is being refreshed. Static memory cells do not require refreshing, but such cells are usually more complex and space consuming than dynamic memory cells. A dynamic memory cell with automatic refreshing capability is one which has a refresh operation that does not require that the stored datum be read. Therefore, other factors being equal, the time interval required to refresh a memory cell with automatic refresh capability is less than that required to refresh a cell without automatic refresh capability. Also, in an array of dynamic memory cells with automatic refresh capability, the number of cells that can be simultaneously refreshed is not limited to the number of sense amps provided.

In the prior art, memory cells with automatic refreshing have been developed, but suffered from various limitations. For example, the four transistor plus charge pumps memory cell requires an area comparable to some static cells and provides only modest power advantages over some static cells. An Automatic Refresh Dynamic Memory was described by H. J. Boll et al, at the International Solid State Circuits Conference held in Feb. 1976, and K Shiga et al described A Monostable CMOS RAM with Self-Refresh Mode at the same meeting and subsequently published a description of the cell in the IEEE Journal of Solid State Circuits, Vol. SC-11, No. 5, Oct. 1976, p. 609. Both of these more recent memory cells required four transistors, and the later required complementary IGFETs. Moreover, in both of the last two automatic refreshing memory cells, the read operation is destructive, so that in an array of such cells, multiple sense amps must be provided.

SUMMARY OF THE INVENTION

The subject of the present invention is a dynamic memory cell with automatic refresh capability which requires only three insulated gate field effect transistors (IGFETs), has very low power consumption, has a non-destructive read out, and has coincident select data entry. With current silicon integrated circuit technology, implementation of this three transistor memory cell requires less area than most static cells. Furthermore, due to the nondestructive read out and the coincident select entry features of the cell, in an array of such cells, only one sense amp is required. Power consumption is minimized because in the data retention mode the only current that flows in the cell is due to leakage and thermal generation, and in the read and write operations, only one power consuming sense amp need be used. A cell is refreshed by the simple operation of bringing the gate of one of the IGFETs from it's normal low potential to a high potential and then back to the initial low potential. The refresh operation can be performed simultaneously on all of the memory cells in an array, if so desired. Also, if desired, the refresh operation can be designed to occur during that interval in other operations which is used for initializing various peripheral circuitry, without appreciably lengthening the cycle time of these other operations, and in this case the refresh operation appears completely transparent to the system.

These and other advantages of the memory cell of the present invention over prior art memory cells will be evident in the following description of the preferred embodiments of this invention.

DESCRIPTION OF THE PREFERRED EMBODIMENTS

In the description of the preferred embodiments of this invention, a qualitative description of the operation of a memory cell will first be given, and then the refresh operation for a particular memory cell will be described quantatively.

Figure 1:
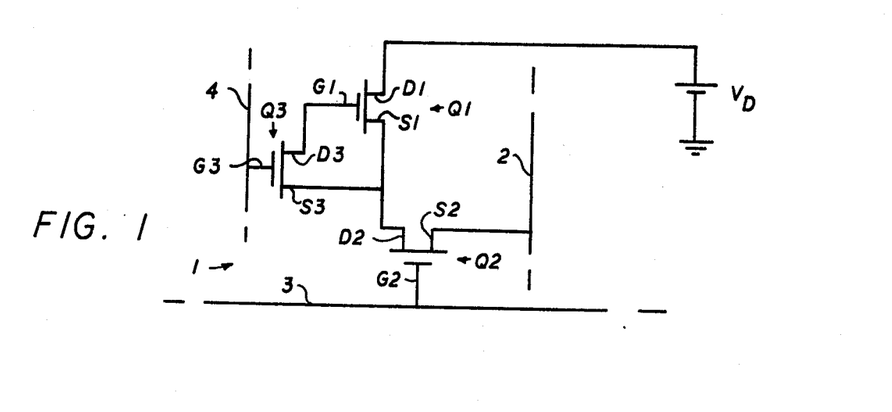
FIG. 1 is a schematic diagram of one embodiment of the memory cell of this invention.

As shown in FIG. 1, one embodiment of the memory cell 1 of this invention utilizes three insulated gate field effect transistors (IGFETs), Q1, Q2, and Q3. The first IGFET, Q1, is an enhancement mode device. Binary datum is represented in the cell 1 by maintaining either a high or a low potential on the gate G1 of Q1. The drain D1 of Q1 is maintained at a constant voltage by voltage source $V_d$. The second IGFET, Q2, is also an enhancement mode device. The source S1 of Q1 is connected to the drain D2 of Q2 and the source S2 of Q2 is connected to the data sense line 2. The gate G2 of Q2 is connected to the select line 3. Q2 is in series with Q1, and is used to control access to the cell 1.

Figure 2:
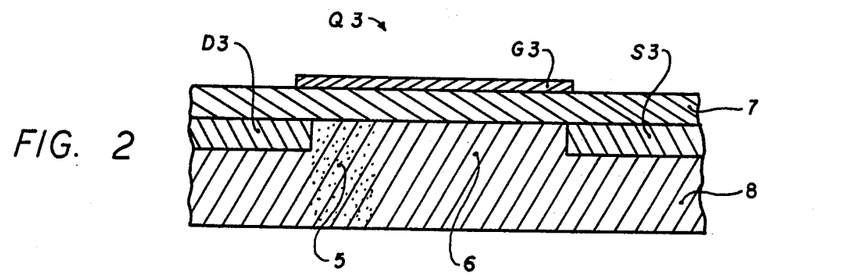
FIG. 2 shows a cross sectional view of transistor Q3 used in the memory cell shown in FIG. 1.

The novel features of this invention are obtained by using a third IGFET, Q3. It is essential that Q3 have two channel regions in series with each other, so that conduction between it's source S3 and it's drain D3 can occur only when the surface potentials of both these regions have the appropriate values. Furthermore, the surface potential vs. gate voltage characteristics are different for these two channel regions. In an approximate way, Q3 can be considered the result of merging two IGFETs which have different threshold voltages and which are in series, and then eliminating the commonly connected drain of the first and the source of the second, and finally connecting the two gates in common. The different surface potential vs. gate voltage characteristics can be obtained by using different doping profiles, and or different interface charge densities, and or different gate insulator materials, and or different gate insulator thicknesses in these two regions, and or by using materials with different work functions for the gates of these two channel regions. In FIG. 2, a cross sectional view of Q3 is shown for the specific case in which different interface charge densities at or near the interface between the insulating material 7 and the semiconducting substrate 8, and different doping profiles in the semiconducting substrate 8 are used in the two channel regions 5, 6, but the same gate material is used, and the same thickness of insulating material 7 separating the gate G3 from the semiconducting substrate 8 is used. After reading and understanding the description of the present invention, those skilled in the arts can readily understand how to vary the other parameters which determine the surface potential vs. gate voltage characteristics so that the required difference in surface potential vs. gate voltage characteristics can be established in the two channel regions.

The special characteristics of Q3 obtained by using these two different channel regions 5, 6 are utilized only in the refresh operation, and Q3 will be described in more detail when the refresh operation is considered. During the read and write operations, and in the data retention mode Q3 can be treated as a normal enhancement mode IGFET.

As shown in FIG. 1, the gate G3 of Q3 is connected to the refresh line 4, the source S3 of Q3 is connected to the source S1 of Q1, and the drain D3 of Q3 is connected to the gate G1 of Q1.

The memory cell 1 shown in FIG. 1 can be implemented using integrated circuit technology, in which case, all the transistors Q1, Q2, and Q3 are formed on a common substrate. In describing the operation of the cell 1, it will be assumed that Q1, Q2 and Q3 are formed on a common substrate, and that this substrate is maintained at ground potential - that is no substrate bias is used. After reading and understanding the following description of the cell's operation with no substrate bais, those skilled in the art can readily understand how a memory cell according to the present invention can be operated when a substrate bias is used. Also, in the following, to facilitate the description of the cell's 1 operation, it will be assumed that Q1, Q2, and Q3 are N channel devices, formed using a silicon substrate. Of course, the memory cell of this invention can also be implemented using P channel IGFETs and using other semiconducting materials. With these assumptions, the potential source $V_d$ must maintain a positive voltage on D1. The requirements on the magnitude of $V_d$ will be considered shortly.

When the memory cell 1 is in the data retention mode, Q2 and Q3 are kept off by maintaining the voltages on G2 and G3 sufficiently low. A one is represented by maintaining the voltage on G1 at potentials such that with S1 at ground potential, Q1 is on. A zero is represented by maintaining the voltage on G1 such that with S1 at ground potential, Q1 is off. All operations start with and end with the cell 1 in the data retention mode.

The datum stored in the memory cell 1 can be determined by using a read operation. In the read operation, the data sense line 2 is initially set at a low potential, near or at ground. Then G2 is brought high, turning Q2 on. Now the potential of the sense line 2 will be determined by the potential on the gate G1 of Q1. If a one is stored in the cell 1, the potential of the sense line 2 will increase, and if a zero is stored in the cell 1, the potential of the sense line will remain low. After detecting the potential change, if any, on the sense line 2 with an appropriate sense amp, the gate G2 is brought low, thereby turning Q2 off. Then the sense line 2 is held low, returning the cell 1 to the data retention mode.

To enter datum in the cell 1, the data sense line 2 is held at an appropriate potential - high to enter a one and low to enter a zero. Then the potentials on G2 and G3 are brought high, turning Q2 and Q3 on. Then regardless of the previous potential of G1, the potential of G1 will settle at a value near or equal to the potential at which the sense line 2 is being held. After the potential of G1 has reached the value required to represent the datum being entered, G2 and G3 are brought low, turning off Q2 and Q3. Then the sense line 2 is held low, and the cell 1 returned to the data retention mode.

In an array of such cells 1, it is often desirable to interconnect the cells 1 such that the terminals of a cell 1 are connected in common with the like terminals of a plurality of other cells 1. The terminals of the cell 1 are the drain D1, the gate G2, the gate G3, and the source S2. There are however, restrictions on the interconnection of the cells 1. First, if the cells 1 are interconnected, when the Q2 of a particular cell 1 in the array is turned on, a plurality of other cells 1 will have their Q2's turned on. So in the read operation, in order for the potential of the sense line 2 to which the cell of interest is connected to indicate the state of the said cell 1, it is necessary that no two cells 1 in the array have both (1) their gates G2 connected to the same select line 3, and (2) their sources S2 connected to the same sense one 2. Second, in an array in which the cells are interconnected, to avoid having to first read and then re-enter datum in other cells 1, when entering datum in one particular cell 1, no two cells 1 should have both (1) their G2's connected to the same select line 3, and (2) their G3's connected to the same refresh line 4. One way to meet the above interconnection requirements is to arrange the cells 1 in rows and columns. Then the G2's of all the memory cells 1 in the same row can be connected in common by means of one of a plurality of select lines 3, the G3's of all the memory cells 1 in the same column can be connected in common by means of one of a plurality of refresh lines 4, and the S2's of all the memory cells 1 in the same column can be connected in common by means of one of a plurality of sense lines 2.

In an array of cells 1 which are interconnected as described above, during the read and write operations, a plurality of cells 1 will have their Q2's turned on. For reasons that will be evident when the refresh operation is considered, it is important that when a zero state cell 1 is in the data retention mode, the potential of it's drain D2 be low. Therefore it is important that all the sense lines 2 in the array which are connected to cells 1 that will have their Q2's turned on during a particular read or write operation, be at a low potential before the Q2's are turned on. If this precaution is taken, then during a read or write operation, as long as a cell's Q3 remains off, if that cell's 1 Q2 is turned on, and then turned off, the datum stored in the cell 1 will not be adversely affected, nor will the cell 1 be left in a state in which subsequent allowed operations will cause the cell 1 to change it's state.

The refresh operation is performed by bringing the gate G3 of Q3 from it's normal low potential to a high potential and then returning it to it's initial low potential.

Figure 3:
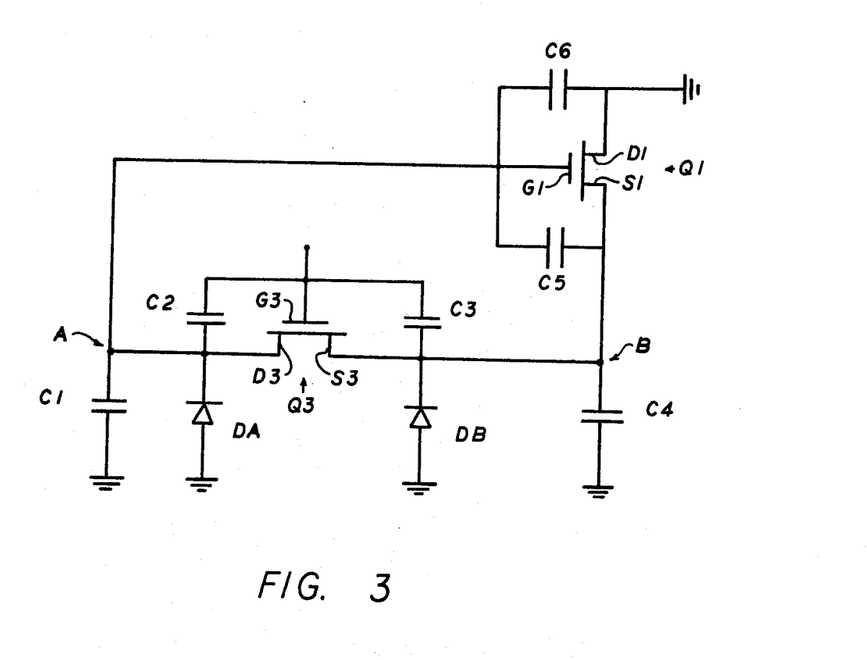
FIG. 3 is a schematic diagram of the cell of FIG. 1 in which some of the parasitic capacitances of the cell shown in FIG. 1 are explicitly shown.

To explain how this operation refreshes the memory cell 1, it is useful to consider the equivalent circuit shown in FIG. 3. FIG. 3 shows explicitly most of the important parasitic elements of the cell 1 of FIG. 1 which effect the refresh operation. The circuit of FIG. 3 is used only in the analysis of the refresh operation, and since Q2 remains off during refreshing, Q2 is not shown in FIG. 3.

The circuit elements shown in FIG. 3 which have not been previously identified have the following physical identification:

C1 — the capacitance of the conductive line connecting G1 to D3
C2 — the capacitance due to gate C3 overlapping drain D3
C3 — the capacitance due to gate G3 overlapping source S3
C4 — the capacitance due to gate G2 overlapping drain D2
C5 — the capacitance due to gate G1 overlapping source S1
C6 — the capacitance og gate G1 minus C5
DA — the diode formed by drain D3
DB — the diode formed by S3, S1, and D2.

DA and DB act as voltage dependent capacitors in the refresh operation. Node A of FIG. 3 is the node formed by G1 and D3, and $V_a$ is the potential of node A. Node B of FIG. 3 is the node formed by S3, S1, and D2, and $V_b$ is the potential of node B. $V_g$ is the potential of gate G3. The channel formed in region 5 of Q3 will be referred to as the left channel, the potential well formed in region 5 will be referred to as the left potential well, and the surface potential in region 5 will be designated by $\phi_l$. Similarly, the channel formed in region 6 of Q3 will be referred to as the right channel, the potential well formed in region 6 will be referred to as the right potential well, and the surface potential in region 6 will be designated $\phi_r$.

There are four separate channel regions in the cell 1 of FIG. 1, and the surface potential vs. gate voltage characteristics for each of the channel regions could be optimized by appropriate processing. However, to minimize the number of processing steps required to implement the cell 1, it will be assumed that only two different surface potential vs. gate voltage characteristics are used in the cell 1. For the examples considered herein, it will be assumed that the characteristics of the channel regions of Q1 and Q2 are identical to the characteristics of the right channel region of Q3.

First an approximate, qualitative description of the refresh operation will be given, and later a specific cell will be analyzed. In the qualitative description, an idealized situation will be considered in which all the parasitic elements shown in FIG. 3, except for DA and DB, can be neglected.

Consider first a cell 1 with a one stored in it, so that node A is high. With Q2 off, node B will be held at some potential lower than node A, by Q1. Due to leakage currents and thermally generated carriers, the potential of node A, $V_a$, will gradually decrease with time. To refresh the cell 1, electrons will be extracted from node A, transferred to node B, and then extracted thru Q1. To accomplish this, the two channel regions 5, 6 of Q3 must be such that as $V_g$ is increased, before current can flow between A and B thru the channel beneath the gate G3 of Q3, node B is pulled higher than node A by the transfer of electrons from node B to the right potential well. Therefore when the voltage on the gate G3, $V_g$, reaches a value such that current can flow thru said channel, electrons will flow from node A to node B. Then, in the ideal case, when $V_g$ is decreased, node A is not allowed to discharge. However, as $V_g$ decreases, $V_b$ will decrease as electrons transfer out of the right potential well to node B, and eventually, $V_a$-$V_b$ will be sufficiently large to turn Q1 on. Then as $V_g$ is further decreased, electrons from node B will be extracted by flowing thru the channel of Q1.

To optimize the performance of the refresh operation for a cell 1 in the one state, the area of the right potential well should be made large and the area of the left potential well should be made small. In the following qualitative description of the refresh operation of the cell 1, the area of the left potential well will assumed to be sufficiently small that any electrons which accumulate therein have negligible effect on the potentials of nodes A and B.

Figure 4:
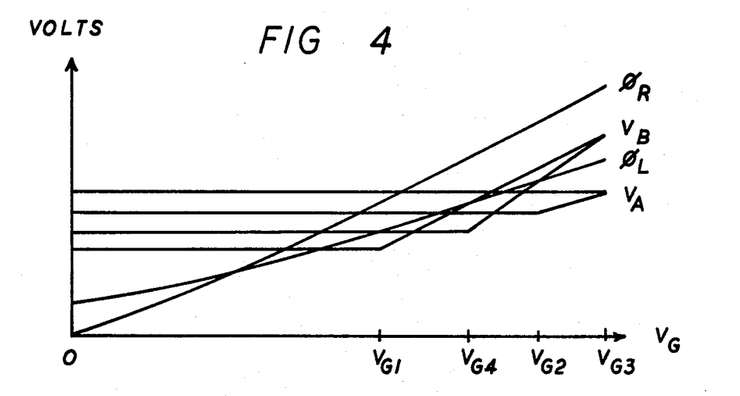
FIG. 4 shows how the internal potentials of the memory cell shown in FIG. 1 vary when a one state cell is refreshed, for an idealized case.

A more detail explaination of the refresh operation for a cell 1 in the one state will now be given, still under the idealized conditions and assumptions described above. The potential $V_a$ and $V_b$, and the surface potentials $\phi_l$ and $\phi_r$, as a function of $V_g$ for this idealized refresh one operation are shown in FIG. 4. Initially $V_a = \lambda V_{ai}$, and $V_b$ is held near $V_{ai}-V_{th1}$, where $V_{th1}$ is the threshold voltage of Q1. As shown in FIG. 4, as $V_g$ is increased from 0 volts to $V_{g3}$, the following occurs:

(1) from O to $V_{g1}$—Both $V_a$ and $V_b$ are constant, and $\phi_r$ and $\phi_l$ increase. At $V_g = V_{gb}$, $\phi_r$ is just below the value required to extract electrons from node B.

(2) from $V_{g1}$ to $V_{g2}$ — In this range, as electrons are extracted from node B by the right potential well, $V_b$ increases. $V_a$ remains constant because Q3 is still held "off" by the low value of $\phi_l$. At $V_g = V_{g2}$, $\phi_l$ is just below the value required to permit electron transfer from node A to node B; and $V_b$ is greater than $V_a$.

(3) from $V_{g2}$ to $V_{g3}$ — In this range, $V_a - \phi_l$ is sufficiently large that electrons transfer from node A to node B, causing $V_a$ to increase, $V_b$ still increases as $\phi_r$ increases. The electrons extracted from node A remain at node B and in the right potential well.

When $V_b$ is greater than $V_a$, Q1 must be kept off. This can be done by, for example, making $V_d$ greater than the maximum value of $V_b$ or by designing and operating the cell 1 so that $V_a-V_d$ never reaches or exceeds the weak inversion potentialo of Q1. After $V_g$ reaches $V_{g3}$, a small time interval is allowed for settling. Then $V_g$ is decreased back to 0 volts, and as shown in FIG. 4, the following occurs:

(1) from $V_{g3}$ to $V_{g4}$ — As electrons transfer from the right potential well to node B, $V_b$ decreases. However, neither $\phi_r$-$V_a$ nor $\phi_r$-$V_b$ is large enough to permit electron transfer between A and B. So even when $V_b$ is less than $V_a$, $V_a$ remains constant at the value it had at $V_{g3}$.

(2) At $V_{g4}$ — Now $V_a$-$V_b$ is just large enough to turn Q1 on.

(3) from $V_{g4}$ to 0 volts — $V_a$ remains constant, and Q1 holds node B near $V_a$-$V_{th}$.

The above description is highly idealized, but is useful in gaining an understanding of the essence of this invention. Note that for some cells 1, and with some methods of operation of some cells 1, electrons transfer from node B to node A thru Q3's channel will occur when $V_g$ is decreasing. However, provided than when $V_g$ is increasing, $V_b$ is greater than $V_a$ before Q3 turns on, allowing electron transfer between nodes A and b, the cell 1 will be refreshed.

Now consider a cell 1 in the zero state. There is of course, no refresh required for such a cell 1, but in an array of cells 1, a cell 1 in the one state can have it's gate G3 connected in common with the gate G3 of another cell 1 which is in the zero state. Then when the one state cell 1 is refreshed, the zero state cell 1 will have it's G3 voltage changed from 0 volts to $V_{g3}$ and then back to 0 volts. Therefore when a cell 1 is in the zero state, pulsing it gate G3 voltage from 0 volts to $V_{g3}$ and back should leave the cell 1 in it's original condition. Actually, slight departures from it's original condition are acceptable, and in some cases desirable.

When a cell 1 is in the zero state and $V_g$ is increased from 0 volts to $V_{g3}$ and then decreased back to 0 volts, several different $V_a$ and $V_b$ vs. $V_g$ curves can be generated, depending on the details of the particular cell 1 under consideration. Let the initial values of $V_a$ and $V_b$ for a zero state cell 1 be 0 volts. Then in all cases, as long as Q1 remains off during the entire refresh cycle, provided that the $\phi_l$ and $\phi_r$ vs. $V_g$ curves are such that $\phi_r$-$V_a$ becomes sufficiently large for electron flow in the left channel at $V_g$ values which are too low for $\phi_r$ to be high enough for the right potential well to start to pull up node B, the cell 1 will return to it's initial condition at the end of the refresh cycle. $\phi_r$ has two critical values — the value required to permit electron flow thru the right channel, and the value required for the electron density in the right potential well to be large enough to significantly increase the potential of node B. The $\phi_r$ value required to start pulling up $V_b$ depends on the capacitance of node B, the area of the right potential well, and the criteria used to define "significantly affect $V_b$". In most cases of interest, a lower $\phi_r$ is required to permit electron flow in the right channel than is required for the right potential well to start pulling $V_b$ up.

The above considerations can be illustrated by following $V_a$ and $V_b$ as $V_g$ is changed from 0 volts to $V_{g3}$ and then back to 0 volts, for several different cases.

Figure 5:
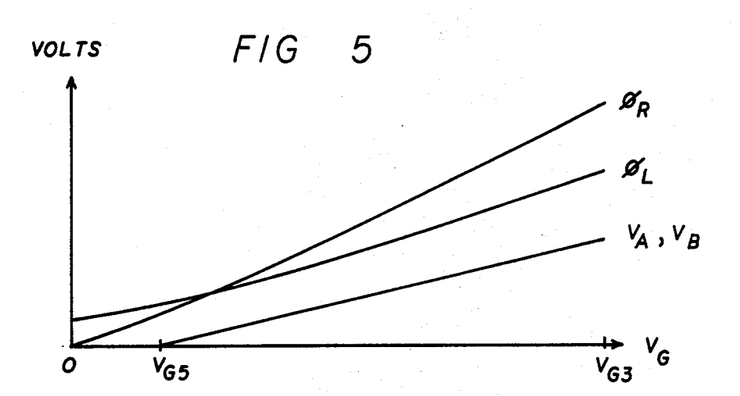
FIG. 5 shows one way the internal potentials of the memory cell shown in FIG. 1 can vary when a zero state cell is refreshed, for an idealized case.

First consider the zero refresh case illustrated in FIG. 5. The $\phi_l$ and $\phi_r$ curves shown in FIG. 5 as for the case when there are no electrons in these potential wells. Initially, $V_g = V_a = V_b = 0$ volts. As $V_g$ increases from 0 volts to $V_{g3}$, the following occurs:

(1) from 0 volts to $V_{g5}$ — both $V_a$ and $V_b$ remain constant at 0 volts, as $\phi_l$ and $\phi_r$ increase. $\phi_l$ becomes large enough to permit electron flow from node A to node B before $\phi_r$ is large enough to permit such flow. Both $\phi_l$ and $\phi_r$ are large enough to permit electron flow from node A to node B before $V_g$ reaches $V_{g5}$. At $V_g = V_{g5}$, $\phi_r$ is just below the value required to start pulling node B up.

(2) from $V_{g5}$ to $V_{g3}$ — Both $V_a$ and $V_b$ are pulled up by the right potential well, and $V_a$ remains equal to $V_b$ because $\phi_r$-$V_a$ and $\phi_r$-$V_a$ are always large enough to allow electrons to flow from node A to node B. Q1 must be kept off and this can be accomplished by, for example, making $V_d$ greater than the maximum value of $V_a$.

As $V_g$ decreases from $V_{g3}$ to 0 volts, the following occurs:

(1) from $V_{g3}$ to $V_{g5}$ — Both $V_a$ and $V_b$ decrease along the same curve they followed when $V_g$ was increasing from $V_{g5}$ to $V_{g3}$, and of course $V_a$ remains equal to $V_b$. Note that $\phi_r$-$V_b$ and $\phi_r$-$V_b$ are always large enough to allow electrons to flow from node B to node A.

(2) From $V_{g5}$ to 0 volts — At $V_g$;32 $V_{g5}$, both $V_a$ and $V_b$ have returned to 0 volts, and they remain at 0 volts while $\phi_l$ and $\phi_r$ decrease.

Figure 6:
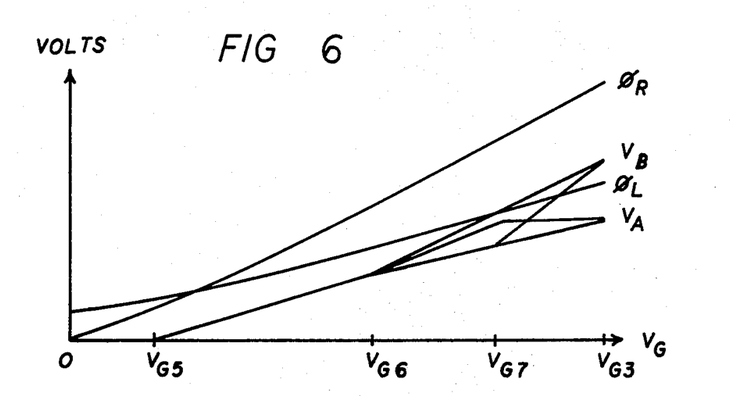
FIG. 6 shows a second way the internal potentials of the memory cell shown in FIG. 1 can vary when a zero state cell is refreshed, for an idealized case.

The second refresh case to be considered is a bit more complicated. This case occurs when the right potential well is sufficiently large compared to the capacitance of DA and DB, and $\phi_l$ increases sufficiently slowly with increasing $V_g$, that $V_a$ is pulled up to a voltage such that $\phi_r$-$V_a$ is small and restricts the flow of electrons from node A to node B. This case is illustrated in FIG. 6. Again the $\phi_l$ and $\phi_r$ curves shown in FIG. 6 are for the case where there are no electrons in these potential wells. Initially $V_g = V_a = V_b = 0$ volts. As $V_g$ is increased from 0 volts to $V_{g3}$, the following occurs:

(1) from 0 volts to $V_{g5}$ — Both $V_a$ and $V_b$ remain constant at 0 volts, as $\phi_l$ and $\phi_r$ increase. $\phi_l$ becomes large enough to permit electron flow from node A to node B before $\phi_r$ is large enough to permit such flow. Both $\phi_l$ and $\phi_r$ are large enough to permit electron flow from node A to node B before $V_g$ reaches $V_{g5}$. At $V_g = V_{g5}$, $\phi_r$ is just below the value required to start pulling up node B.

(2) from $V_{g5}$ to $V_{g6}$ — The right potential well pulls up nodes A and B together. $\phi_r$-$V_a$ is large enough to permit node A to follow node B. $V_a$ is increasing faster than $\phi_l$ is. At $V_g = V_{g6}$, $\phi_r$-$V_a$ is just at the value which will prevent electrons from flowing from node A to node B.

(3) from $V_{g6}$ to $V_{g3}$ — Node B continues to be pulled up by the right potential well, and node A is also pulled up, but node A is pulled up less than node B because electron flow from A to B is limited by the left channel. At $V_g = V_{g3}$, $V_b$ is greater than $V_a$.

As $V_g$ is increased from $V_{g3}$ to 0 volts, the following occurs:

(1) from $V_{g3}$ to $V_{g7}$ — Because $\phi_r$-$V_b$ is too small to permit electron flow from node A to node B, $V_a$ remains constant at the value it had when $V_g = V_{g3}$. $V_b$ decreases as electrons transfer from the right potential well to node B. Note that the slope of the $V_b$ vs. $V_g$ curve is steeper than $V_g$ is decreasing than it was when $V_g$ was increasing, because there are additional electrons at node B and in the right potential well when $V_g$ is decreasing. At $V_g = V_{g7}$, $V_b$ reaches the value $V_a$ had when $V_g$ was increasing and was at the value $V_{g7}$. At $V_g = V_{g7}$, $\phi_r$-VHd b is just below the value which will allow electron flow from node B to node A.

(2) from $V_{g7}$ to $V_{g6}$ — Both $V_a$ and $V_b$ decrease since electron transfer from node B to node A is now possible because $\phi_r$-$V_b$ is sufficiently large. Note that $V_b$ follows the curve $V_a$ followed when $V_g$ was increasing. At $V_g = V_{g6}$, $V_b$ is at the same value it had when $V_g$ was increasing and had the value $V_{g6}$. Charge conservation requires that $V_a$ also be at the value it had when $V_g$ was increasing and had the value $V_{g6}$. Therefore $V_a = V_b$ at $V_g = V_{g6}$.

(3) from $V_{g6}$ to $V_{g5}$ — Both $V_a$ and $V_b$ decrease along the same curve they followed when $V_g$ was increasing. At $V_g = V_{g5}$, $V_a = V_b = 0$ volts.

(4) from $V_{g5}$ to 0 volts — Both $V_a$ and $V_b$ remain constant at 0 volts, $\phi_l$ and $\phi_r$ decrease.

In the refresh zero case just described, it is important that Q1 not turn on when $V_b$ is less than $V_d$. If $V_b$ ever exceeds $V_d$, and if Q1 turns on when $V_b$ is greater than $V_d$, node B will be discharged, and at the end of the refresh cycle, nodes A and B will be at lower voltages than they were at the start of the refresh cycle. This is acceptable, and even desirable in some cases. However, if Q1 turns on when $V_b$ is less than $V_d$, electrons will be extracted from node B, and at the end of the refresh cycle, node A will be at a higher potential than it was at the start of the refresh cycle. This is undesirable. To prevent Q1 from turning on when $V_b$ is less than $V_d$, the cell 1 must be designed and operated such that whenever $V_b$ is less than $V_d$, $V_a-V_b$ is less than the value required to turn Q1 on. Because the capacitance of node B can be quite small, even subthreshold currents in Q1 are to be avoided.

A third zero refresh case will also be considered. This third case is similar to the second case in that during a portion of the refresh cycle, $V_a$ exceeds $V_b$. Again it is important that Q1 remain off when $V_b$ is less than $V_d$. The requirements on $V_a-V_b$ described in the second zero refresh case apply to this third case also.

Figure 7:
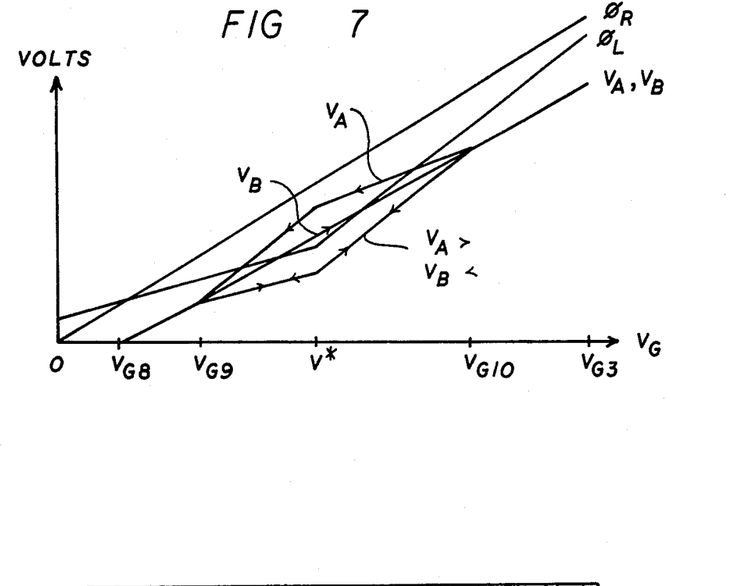
FIG. 7 shows a third way the internal potentials of the memory cell shown in FIG. 1 can vary when a zero state cell is refreshed, for an idealized case.

The third zero refresh case is illustrated in FIG. 7. $\phi_l$ and $\phi_r$ vs. $V_g$ are again shown for the case of empty potential wells. The kink in the $\phi_l$ vs $V_g$ curve at $V_g = V^*$ is due to an assumed abrupt change in the doping density in region 5 of Q3. Initially $V_g = V_a = V_b = 0$ volts. As $V_g$ is increased from 0 volts to $V_{g3}$, the following occurs:

(1) from 0 volts to $V_{g8}$ — Both $V_a$ and $V_b$ remain at 0 volts. $\phi_l$ and $\phi_r$ increase. $\phi_l$ becomes large enough to permit electron flow from node A to node B before $\phi_r$ is large enough to permit such flow. Both $\phi_l$ and $\phi_r$ are large enough to permit electron flow from node A to node B before $V_g$ reaches $V_{g8}$. At $V_g = V_{g8}$, $\phi_r$ is just below the value required to start pulling node B up.

(2) from $V_{g8}$ to $V_{g9}$ — Both $V_a$ and $V_b$ increase as electrons accumulate in the right potential well. $V_a$ remains equal to $V_b$. $V_a$ is increasing faster than $\phi_l$, and at $V_g = V_{g9}$, $\phi_l-V_a$ is just at the value where the left channel restricts electron flow from node A to node B.

(3) from $V_{g9}$ to $V_{g10}$ — As $V_b$ continues to be pulled up by the right potential well, $V_a$ also increases, but the increase in $V_a$ is limited by $\phi_l$. $\phi_l$ increases more rapidly with increasing $V_g$ when $V_g$ is greater than $V^*$ than it did for $V_g$ less than $V^*$. So $V_a$ increases more rapidly with increasing $V_g$ when $V_g$ is greater than $V^*$ than it did when $V_g$ was less than $V^*$. At $V_g = V_{g10}$, $V_a$ is again equal to $V_b$.

(4) from $V_{g10}$ to $V_{g3}$—Both $V_a$ and $V_b$ are pulled up by the right potential well, and $V_a$ remains equal to $V_b$.

As $V_g$ decreases from $V_{g3}$ to 0 volts, the following occurs:

(1) from $V_{g3}$ to $V_{g10}$—As $V_g$ decreases, $V_a$ and $V_b$ decrease, and remain equal. At $V_g = V_{g10}$, $\phi_1 - V_b$ is just at the value required to restrict electron transfer from node B to node A.

(2) from $V_{g10}$ to $V_{g9}$—Both $V_a$ and $V_b$ decrease, but $\phi_1$ restricts electron transfer from node B to node A, so $V_b$ is not equal to $V_a$. $V_b$ follows the curve $V_a$ followed when $V_g$ was increasing. At $V_g = V_{g9}$, $V_b$ has the same value it had when $V_g$ was increasing and $V_g = V_{g9}$. So $V_a = V_b$ at $V_g = V_{g9}$.

(3) from $V_{g9}$ to $V_{g8}$—Both $V_a$ and $V_b$ decrease and remain equal. At $V_g = V_{g8}$, $V_a = V_b = 0$ volts.

(4) from $V_{g8}$ to 0 volts—$V_a$ and $V_b$ remain at 0 volts, and $\phi_1$ and $\phi_r$ decrease.

Other refresh cases could be considered, but the above one refresh example and the three zero refresh examples, illustrate the type of behavior that occurs.

In the above discussions of the refresh cycle, quasi steady state has been assumed. That is $V_g$ is assumed to increase slow enough that for any $V_g$, $V_a$ and $V_b$ are always very near the value they would have at that value of $V_g$ under steady state conditions, provided that there is no generation or leakage currents. In most cases, the capacitances of nodes A and B will be sufficiently small, and the transconductances of Q1 and Q3 will be sufficiently large, and the response time of electrons in the potential wells will be sufficiently fast, that the assumed quasi steady state conditions will exist. When this is not the case, the description of the refresh operation is more difficult. However, the principles of this invention illustrated in the above cases can be applied to memory cells in which the refresh operation does not take place under quasi steady state conditions.

Figure 8:
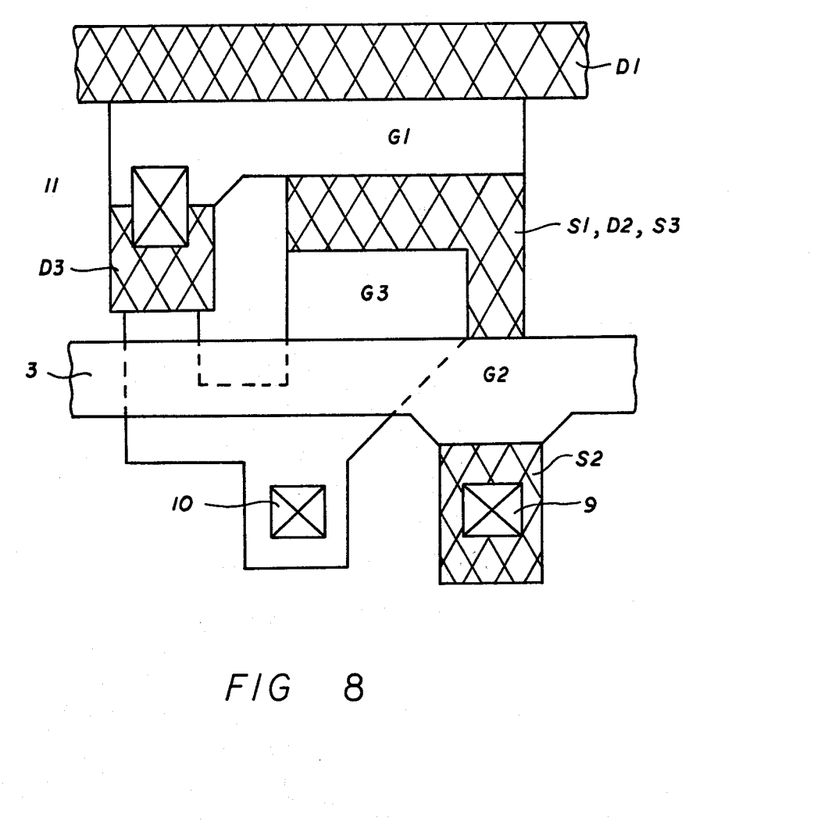
FIG. 8 shows one possible layout for the memory cell shown in FIG. 1.

FIG. 8 shows one possible layout for the cell 1 shown in FIG. 1. In FIG. 8, G1 and G3 are formed by a first conductive polysilicon layer, insulated by about 1,000 Angstroms of $SiO_2$ from the silicon substrate, and G2 is formed by a second polysilicon layer insulated by about 1,000 Angstroms of $SiO_2$ from the silicon substrate. The select line 3 is also formed by the second polysilicon layer, and is insulated from the silicon substrate by about 10,000 Angstroms of $SiO_2$. The sense line 2 and the refresh line 4 are formed of aluminum, but in the interest of clarity, these two aluminum lines are not shown in FIG. 8. These two aluminum lines would run vertically, and make contact to S2 and G3 respectively, at the two contact areas 9, 10 shown in FIG. 8. The layout shown in FIG. 8 has been designed so that in an array, by inverting the layout of the cells located just above and just below the cell 1 shown in FIG. 8, two cells can utilize one common drain D3, and two cells can utilize the contacts 9, 10. The diffused regions which form the drain D1, the drain D3, and the combined source S1, source S3, and drain D2 are assumed to be 1 micron deep and therefore these diffusions extend about 1 micron beneath the adjacent polysilicon lines. The contact between gate G1 and drain D3 is formed by an aluminum dot 11, but a buried contact, in which the polysilicon makes direct contact with the diffused drain D3 could also be used. The cell 1 shown in FIG. 8 occupies 990 square microns.

The refresh operation has been analyzed for the cell 1 whose layout is shown in FIG. 8 using the equivalent circuit shown in FIG. 3. In these calculations, a uniform doping density of $10^{15}$ acceptors/cm.$^3$ has been used in those channel regions characterized by $\phi_r$, and a uniform doping density of $8 \times 10^{15}$ acceptors/cm.$^3$ has been used in the left channel region of Q3. When there are no electrons in the potential wells, $\phi_r$ and $\phi_1$ are related to $V_g$ by the equations:

$$V_g = -0.436 + \phi_r + 0.528 \phi_r^{\frac{1}{2}}$$

$$V_g = -1.52 + \phi_1 + 1.44 \phi_1^{\frac{1}{2}}$$

With $V_a = V_b = V_g = 0$ volts, the capacitances shown in FIG. 3 have the following values:

$C1 = 2.42 \times 10^{-15}$ Farads $C2 = 1.73 \times 10^{-15}$ Farads $C3 = 6.21 \times 10^{-15}$ Farads $C4 = 1.73 \times 10^{-15}$ Farads $C5 = 5.52 \times 10^{-15}$ Farads $C6 = 11.65 \times 10^{-15}$ Farads.

The capacitance of DA is $6.56 \times 10^{-15}$ Farads, and the capacitance of DB is $14.80 \times 10^{-15}$ Farads. The capacitances C6, DA and DB are voltage dependent.

Figure 9:
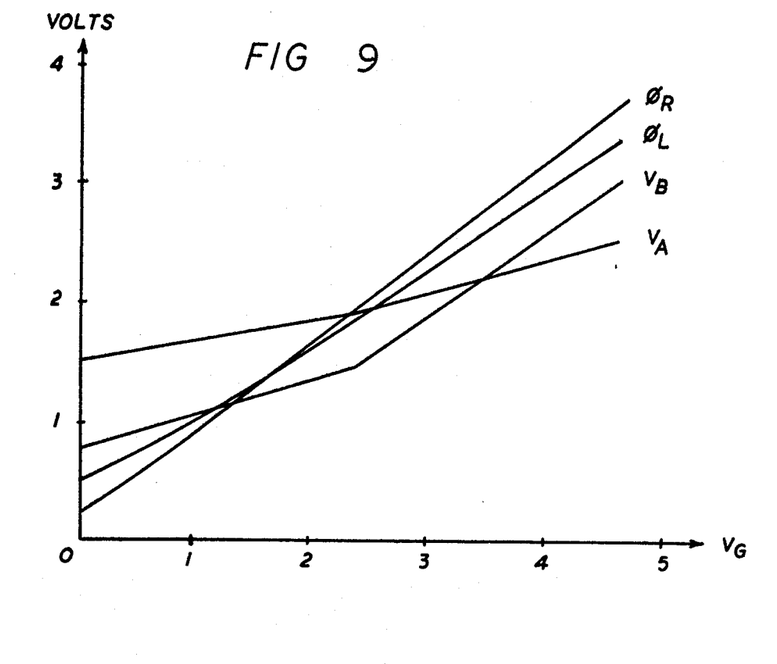
FIG. 9 shows how the internal potentials of the memory cell shown in FIG. 8 vary when a one state cell is refreshed.

FIG. 9 shows how $V_a$ and $V_b$ vary during the increasing $V_g$ portion of the one refresh operation. In this calculation, transfer of electrons from node A to node B has been mathematically restricted until $V_g = V_{gmax}$. This was done to simplify the calculations. Note that the principle effects of including the capacitances C1 thru C6 in the calculation is to cause $V_a$ and $V_b$ to increase with increasing $V_g$ even when the right potential well is not pulling node B up, and to couple $V_a$ and $V_b$.

Initially $V_a = 1.50$ volts, and $V_b = 0.78$ volts. At $V_g = 2.27$ volts, the right potential well begins to pull node B up. At $V_g = 4.5$ volts, $V_a = 2.57$ volts, and $V_b = 3.05$ volts, $\phi_r = 3.6$ volts, and $\phi_1 = 3.4$ volts. These values were calculated with no electron transfer allowed between nodes A and B thru Q3's channel. At $V_g = 4.5$ volts, $V_b$ is greater than $V_a$, and $\phi_1$ - $V_a$ is large enough to permit electron transfer thru Q3's channel. If electron transfer is now allowed, $V_a$ will rise to about 2.72 volts, and $V_b$ will decrease to about 3.00 volts. Then when $V_g$ is decreased to 0 volts, provided that there is negligible electron flow from node B to node A thru Q3's channel, at $V_g = 0$ volts, $V_a = 1.63$ volts, and $V_b = 0.90$ volts. Any leakage from node B to node A thru Q3 during the decreasing $V_g$ portion of the refresh cycle will result in a smaller increase in $V_a$. The subthreshold characteristics of Q3 must be considered when such leakage is examined.

Even if there is leakage thru Q3, the requirements for a one refresh—that Q3 be off when $V_a = V_b$ on the increasing portion of the one refresh cycle, and that assuming no electron transfer from node A to node B thru Q3's channel occurs while $V_g$ is increasing, at $V_{gmax}$ $V_b$ is greater than $V_a$, and $\phi_1$ - $V_a$ and $\phi_r$ - $V_a$ are sufficiently large to allow electrons to transfer from node A to node B - are met. Therefore $V_a$ must be increased by the refresh cycle.

A rather small increase in $V_a$ is obtained by the above refresh cycle, but this does not require unduly frequent refreshing, because while the thermally generated electrons and leakage currents that discharge node A originate in D3 and the left channel region of A3, the capacitance of node A includes the relatively large gate capacitance C6 + C5.

Figure 10:
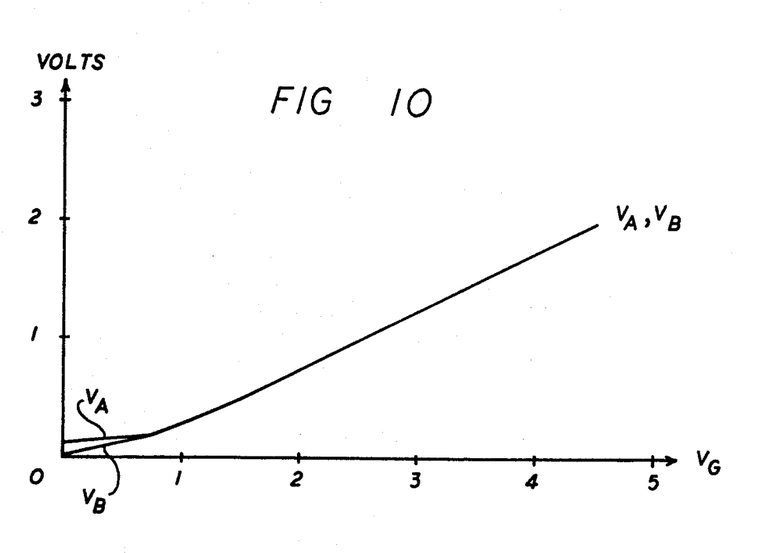
FIG. 10 shows how the internal potentials of the memory cell shown in FIG. 8 vary when a zero state cell is refreshed.

$V_a$ and $V_b$ during the zero refresh for the cell 1 whose layout is shown in FIG. 8 is illustrated in FIG. 10. Note that if $V_a$ is to be returned to it's initial state at the end of the refresh cycle, the initial value of $V_a$ must be about 0.12 volts. Again C1 thru C6 cause $V_a$ and $V_b$ to increase when $V_g$ is increasing even though $\phi_r$ is not large enough to pull node B up. At $V_g = 0.81$ volts, Q3 is on, and $V_a$ remains equal to $V_b$ as $V_g$ increases to 4.5 volts. This zero refresh cycle most nearly resembles the first zero refresh case considered qualitatively. On decreasing $V_g$, $V_a$ remains equal to $V_b$ until $V_g$ has decreased to 0.81 volts. Then as $V_g$ returns to 0 volts, $V_a$ returns to 0.12 volts, and $V_b$ returns to 0 volts.

Since $V_b$ rises to about 3.0 volts for this particular cell under the assumed initial condition, $V_d$ should be at least 3.0 volts. Under different initial conditions, $V_b$ can rise slightly higher, so $V_d$ should probably be about 3.5 volts.

There are many tradeoff in designing a memory cell such as the one shown in FIG. 1. The cell shown in FIG. 8 was designed to operate from a single 5 volt supply, buried contacts were not used to save one masking step, and minimization of cell size was emphasized over fast access time. If larger voltages are provided, the performance of the cell can be improved. In particular a larger $V_a$ can be obtained for the one state. Also, if technological constraints on the gate insulator thickness and or minimum line widths and spacings are relaxed, improved cell performance can be obtained.

Figure 11:
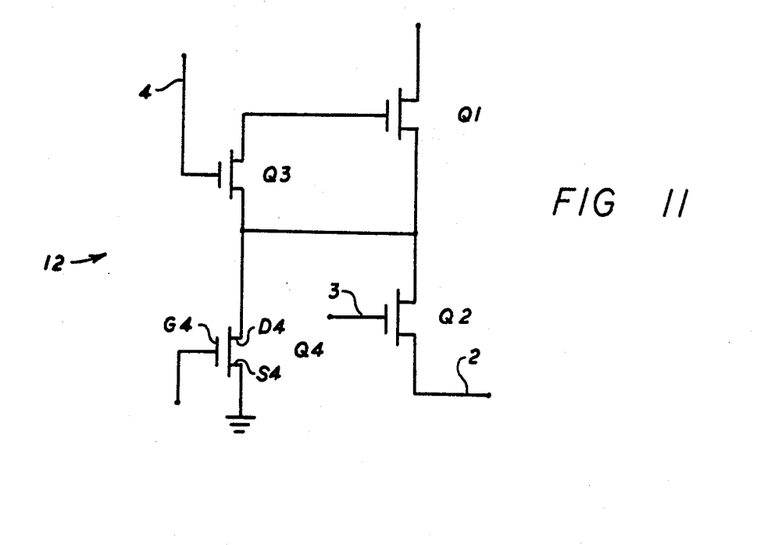
FIG. 11 illustrates schematically a first alternative embodiment of the memory cell of this invention.

As was mentioned previously, it is important that when a zero state cell 1 is in the data retention mode, $V_b$ be near or at 0 volts for proper operation of the refresh cycle. If however, in a particular application it is found that noise voltages, and or leakage currents cause node B to be at voltages significantly larger than zero, the cell 1 shown in FIG. 1 can be modified to form the cell 12 shown in FIG. 11, by adding transistor Q4. As shown in FIG. 11, Q4 has it's source S4 at ground potential, and it's drain D4 connected in sommon with S3. Q4 is designed such that, and the voltage applied to it's gate G4 is such that the potential of node B of zero state cells 9 in the data retention mode, is held low. Q4 should be designed and operated such that it does not greatly increase the power consumption of a one state cell 12 in the data retention mode, so that it does not greatly increase the pull up time for a one state cell 12 in the read operation, and so that it does not greatly increase the time required to enter datum in a cell 12. If desired, Q4 can be turned off during the enter, read, and refresh operations, and be maintained on only when the cell 12 is in the data retention mode. Adding Q4 to the cell 1 shown in FIG. 1 should be avoided whenever possible.

Figure 12:
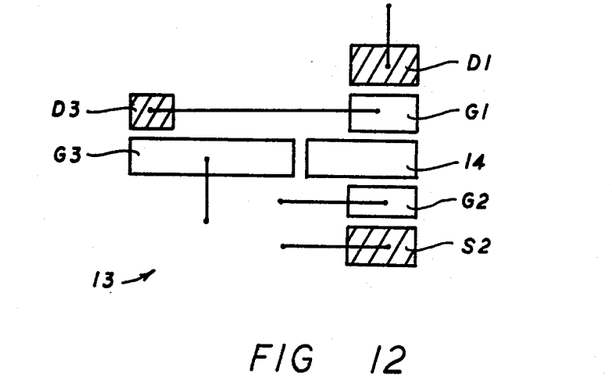
FIG. 12 illustrates schematically a second alternative embodiment of the memory cell of this invention.

A second alternative embodiment of this invention is shown in FIG. 12. The memory cell 13 shown in FIG. 12 has been obtained from the memory cell 1 of FIG. 1 by eliminating the diffused region which formed S1, D2 and S3 and using an electrode 14 to form a potential well in the semiconductor. This potential well serves the same function as the N diffusion region did - it provides a channel for minority carriers between the gate regions of Q1, Q2, and Q3. If necessary, a voltage can be maintained on electrode 14 to establish the required potential well.

I claim:
1. A semiconductor memory cell comprised of
a first IGFET and a second IGFET, both of said IGFETs having a source, a drain, and a gate,
the said source of said first IGFET and the said source of said second IGFET being connected in common,
the said gate of said first IGFET and the said drain of said second IGFET being connected in common,
said second IGFET having a first channel region and a second channel region, both said first and said second channel regions being located generally beneath the said gate of said second IGFET, said source of said second IGFET, said first channel region, said second channel region, and said drain of said second IGFET being disposed such that they are electrically in series, in the order specified above, and the electronic properties of said first channel region being related to the electrical potential of said gate of said second IGFET by one set of parameters, the electronic properties of said second channel region being related to the electrical potential of said gate of said second IGFET by a second set of parameters, and said first set of parameters being different from said second set of parameters.

2. The memory cell of claim 1 wherein said first channel region and said second channel region are such that in the absence of a significant number of minority carriers in said first and said second channel regions, firstly, when the magnitude of the potential of said gate of said second IGFET is relatively small, the magnitude of the surface potential of said first channel region is less than the magnitude of the surface potential of said second channel region, and secondly, when the magnitude of the potential of said gate of said second IGFET is relatively large, the magnitude of the surface potential of said first channel region is greater than the magnitude of the surface potential of said second channel region.

3. The memory cell of claim 1 wherein the magnitude of the threshold voltage of said first channel region is greater than the magnitude of the threshold voltage of said second channel region.

4. The memory cell of claim 1 wherein said second IGFET is an N channel device, and the threshold voltage of said first channel region is greater than the threshold voltage of said second channel region.

5. The memory cell of claim 1 wherein the fraction of the area of said gate of said second IGFET which is generally above said first channel region is larger than the fraction of the area of the said gate to said second IGFET which is generally above said second channel region.

6. The memory cell of claim 1 wherein the drain of a third IGFET is connected in common with the said source of said first IGFET.

7. A plurality of the memory cell of claim 6 wherein the said memory cells are disposed in rows and columns such that each of said memory cell appears in one of the said rows and in one of the said columns, the gates of said third IGFETs of those of said memory cells appearing in the same row being connected in common, the sources of said third IGFETs of those of said memory cells appearing in the same column being connected in common, and the said gates of said second IGFETs of those of said memory cells appearing in the same column being connected in common.

8. In the class of semiconductor dynamic memory cells wherein a P type semiconducting substrate in which a first N type region and a second N type region have been formed, is utilized to form a memory cell, and wherein the said memory cell can be refreshed without having to first determine the datum stored therein, and wherein in the data retention mode, a one is represented in said memory cell by maintaining the potential of said first N type region at a positive potential within a certain range, and maintaining the potential of said second N type region at a positive potential no greater than the potential of said first N type region, a method of refreshing said memory cell, comprising the steps of forming in said semiconducting substrate a first potential well for electrons, said first potential well being disposed with respect to said first N type region such that when the potential energy for electrons in said first potential well is sufficiently low, electrons can transfer from said first N type region to said first potential well, forming in said semiconducting substrate a second potential well for electrons, said second potential well being disposed with respect to said second N type region such that when the potential energy for electrons in said second potential well is sufficiently low, electrons can transfer from said second N type region to said second potential well, said first and said second potential wells being formed in a manner such that if a one is stored in said memory cell, before the potential energy for electrons in said first potential well is sufficiently low to permit a significant number of electrons to flow from said first N type region to said first potential well, the potential energy for electrons in said second potential well becomes low enough to cause a sufficient number of electrons to transfer from said second N type region to said second potential well to increase the potential of said second N type region.

9. In the class of semiconductor dynamic memory cells described in claim 8 wherein in the data retention mode, a zero is represented in a memory cell by maintaining the potential of said first N type region at a potential less than the potential of said first N type region when a one is stored in the said memory cell and said memory cell is in the data retention mode, the method of refreshing said memory cell of claim 9 wherein said first and said second potential wells are formed in a manner such that if a zero is stored in said memory cell, before the potential energy for electrons in said second potential well becomes low enough to cause a sufficient number of electrons to transfer from said second N type region to said second potential well to significantly increase the potential of said second N type region, the potential energy for electrons in said first potential well becomes low enough to permit electrons to transfer from said first N type region to said first potential well.

10. The method of claim 9 wherein said first and said second potential wells are formed by applying an appropriate potential between said semiconducting substrate and a first electrode in proximity to and insulated from said semiconducting substrate.

11. The method of claim 9 wherein said first and said second potential wells are formed such that for certain values of the potential energy for electrons in said first potential well, and for certain values of the potential energy for electrons in said second potential well, electrons can transfer between said first and said second potential wells.

12. The method of claim 8 wherein said first and said second potential wells are formed in a manner such that if a one is stored in said memory cell, before the potential energy for electrons in said first potential well is sufficiently low to permit a significant number of electrons to flow from said first N type region to said first potential well, the potential energy for electrons in said second potential well becomes low enough to cause a sufficient number of electrons to transfer from said second N type region to said second potential well to increase the potential of said second N type region to a value greater than the potential of said first N type region.

13. The method of claim 12 wherein after a sufficient number of electrons have transferred from said second N type region to said second potential well to increase the potential of said second N type region to a value greater than the potential of said first N type region,
manipulating the said first and said second potential wells such that electrons can transfer from said first N type region to said first potential well, and electrons can transfer from said first potential well to said second potential well,
transferring electrons from the said first N type region to the said second potential well, thus increasing the potential of said first N type region, and
thereafter manipulating said first and said second potential wells such that firstly, electron transfer from said second to said first potential well is restricted, and secondly, that said first N type region remains at a higher potential than it was before the said transfer of electrons from said first N type region to the said second potential well.

14. The method of claim 13 wherein by connecting the gate of a first IGFET to the said first N type region, and connecting the source of said first IGFET to the said second N type region, and by connecting the drain of said first IGFET to a suitable voltage source, after the potential of said first N type region has been increased and electron transfer from said second to said first potential well is restricted, the potential of said second N type region is increased.

15. In the class of semiconductor dynamic memory cells
wherein an N type semiconducting substrate in which a first P type region and a second P type region have been formed, is utilized to form a memory cell, and
wherein the said memory cell can be refreshed without having to first determine the datum stored therein, and
wherein in the data retention mode, a one is represented in said memory cell by maintaining the potential of said first P type region at a negative potential within a certain range, and maintaining the potential of said second P type region at a potential no more negative than the potential of said first P type region,
a method of refreshing said memory cell, comprising the steps of forming in said semiconducting substrate a first potential well for holes, said first potential well being disposed with respect to said first P type region such that when the potential energy for holes in said first potential well is sufficiently low, holes can transfer from said first P type region to said first potential well,
forming in said semiconducting substrate a second potential well for holes, said second potential well being disposed with respect to said second P type region such that when the potential energy for holes in said second potential well is sufficiently low, holes can transfer from said second P type region to said second potential well,
said first and said second potential wells being formed in a manner such that if a one is stored in said memory cell, before the potential energy for holes in said first potential well is sufficiently low to permit a significant number of holes to flow from said first P type region to said first potential well, the potential energy for holes in said second potential well becomes low enough to cause a sufficient number of holes to transfer from said second P type region to said second potential well to decrease the potential of said second P type region.

16. The method of claim 15 wherein said first and said second potential wells are formed in a manner such that if a one is stored in said memory cell, before the potential energy for holes in said first potential well is sufficiently low to permit a significant number of holes to flow from said first P type region to said first potential well, the potential energy for holes in said second potential well becomes low enough to cause a sufficient number of holes to transfer from said second P type region to said second potential well to decrease the potential of said second P type region to a value less than the potential of said first P type region.

17. In the class of semiconductor dynamic memory cells described in claim 15 wherein in the data retention mode, a zero is represented in a memory cell by maintaining the potential of said first P type region at a potential greater than the potential of said first P type region when a one is stored in the said memory cell and said memory cell is in the data retention mode, the method of refreshing said memory cell of claim 16 wherein
said first and said second potential wells are formed in a manner such that if a zero is stored in said memory cell, before the potential energy for holes in said second potential well becomes low enough to cause a sufficient number of holes to transfer from said second P type region to said second potential well to significantly decrease the potential of said second P type region, the potential energy for holes in said first potential well becomes low enough to permit holes to transfer from said first P type region to said first potential well.

18. The method of claim 17 wherein said first and said second potential wells are formed by applying an appropriate potential between said semiconducting substrate and a first electrode in proximity to and insulated from said semiconducting substrate.

19. In the class of semiconductor dynamic memory cells
wherein a semiconducting substrate of one extrinsic conductivity type in which a first doped region of conductivity type opposite that of said semiconducting substrate has been formed, and in which a first potential well for the minority charge carriers of the said semiconducting substrate has been formed, is utilized to form a memory cell, and
wherein the said memory cell can be refreshed without having to first determine the datum stored therein, and
wherein in the data retention mode a one is represented in the said memory cell by maintaining the potential of said first doped region within a first certain range, and maintaining the potential of said first potential well such that the potential energy for the minority carriers of the said semiconducting substrate is lower in said first doped region than it is anywhere within said first potential well, a method of refreshing said memory cell, comprising the steps of forming in said semiconducting substrate a second potential well for the minority charge carriers of said semiconducting substrate, said second potential well being disposed with respect to said first doped region such that when the potential energy for minority carriers in said second potential well is sufficiently low, minority carriers can transfer from said first doped region to said second potential well, forming in said semiconducting substrate a third potential for the minority carriers of said semiconducting substrate, said third potential well being disposed with respect to said first potential well such that when the potential energy for minority carriers in said third potential well is sufficiently low, minority carriers can transfer from said first potential well to said third potential well, said second and said third potential wells being formed in a manner such that if a one is stored in said memory cell, before the potential energy for minority carriers in said second potential well is sufficiently low to permit a significant number of minority carriers to transfer from said first doped region to said second potential well, the potential energy for minority carriers in said third potential well becomes low enough to cause a sufficient number of minority carriers to transfer from said first potential well to said third potential well to significantly increase the potential energy for minority carriers in said first potential well.

* * * * *